(12) United States Patent
Jones et al.

(10) Patent No.: US 6,184,576 B1
(45) Date of Patent: *Feb. 6, 2001

(54) PACKAGING AND INTERCONNECTION OF CONTACT STRUCTURE

(75) Inventors: Mark R. Jones, Mundelein; Theodore A. Khoury, Chicago, both of IL (US)

(73) Assignee: Advantest Corp., Tokyo (JP)

( * ) Notice: Under 35 U.S.C. 154(b), the term of this patent shall be extended for 0 days.

This patent is subject to a terminal disclaimer.

(21) Appl. No.: 09/157,842

(22) Filed: Sep. 21, 1998

(51) Int. Cl.[7] .................................................. H01L 23/48
(52) U.S. Cl. .................. 257/696; 257/669; 257/673; 257/690; 257/692; 257/700; 257/784; 257/780; 257/48; 257/778; 361/736; 361/737; 361/743; 361/746; 361/760; 361/761; 361/820
(58) Field of Search ............................ 257/696, 669, 257/673, 690, 692, 700, 784, 778, 780, 48; 361/736, 737, 743, 746, 760, 761, 820

(56) References Cited

U.S. PATENT DOCUMENTS

| | | | |
|---|---|---|---|
| 4,904,191 | * 2/1990 | Munday et al. | 439/68 |
| 5,390,080 | * 2/1995 | Melton et al. | 361/765 |
| 5,900,738 | * 5/1999 | Khandros et al. | 324/764 |
| 5,983,493 | * 11/1999 | Eldridge et al. | 29/855 |
| 6,031,282 | * 2/2000 | Jones et al. | 257/692 |
| 6,043,563 | 3/2000 | Eldridge . | |

* cited by examiner

*Primary Examiner*—Mahshid Saadat
*Assistant Examiner*—Matthew E. Warren
(74) *Attorney, Agent, or Firm*—Muramatsu & Associates

(57) ABSTRACT

A packaging and interconnection for connecting a contact structure to an outer peripheral component with a short signal pass length to achieve a high frequency operation. The packaging and interconnection is formed of a contact structure made of conductive material and formed on a contact substrate through a photolithography process, a contact trace formed on the contact substrate and electrically connected to the contact structure at one end, and the other end of the contact trace is extended toward an edge of the contact substrate, a connection target provided at an outer periphery of the contact structure to be electrically connected with the other end of the contact trace, an elastomer provided under the contact substrate for allowing flexibility in the interconnection and packaging of the contact structure, and a support structure provided between for supporting the contact structure, the contact substrate and the elastomer.

49 Claims, 13 Drawing Sheets

Fig. 3
(Prior Art)
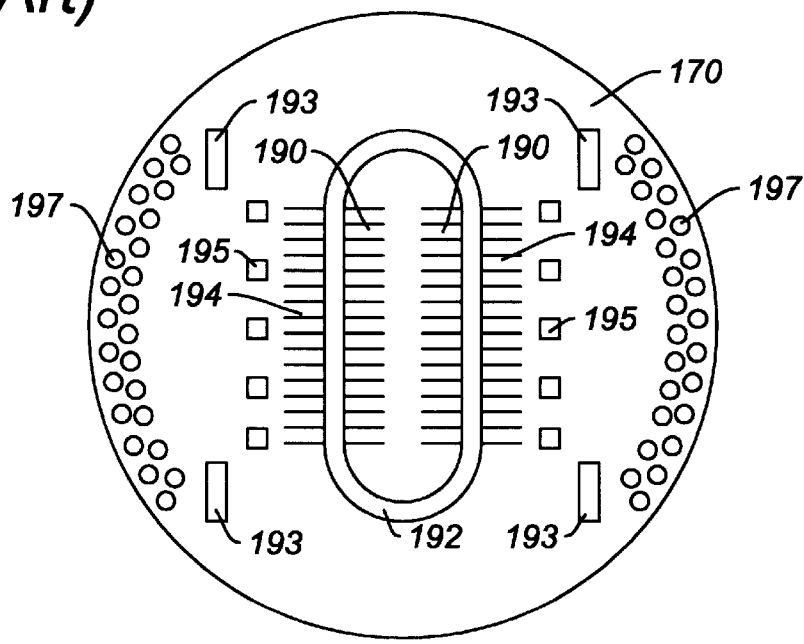
Fig. 4A
(Prior Art)
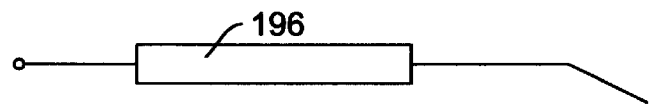
Fig. 4B
(Prior Art)
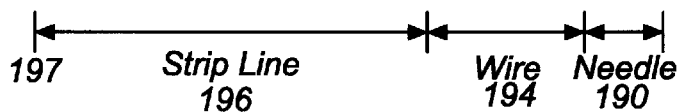
Fig. 4C
(Prior Art)
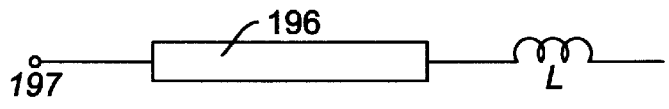
Fig. 4D
(Prior Art)
Fig. 4E
(Prior Art)
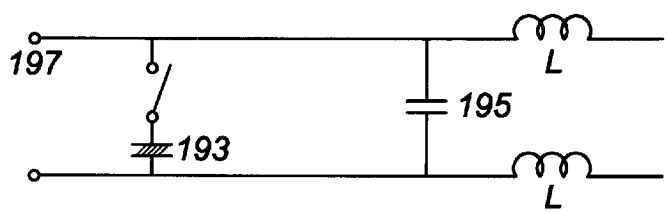

PACKAGING AND INTERCONNECTION OF CONTACT STRUCTURE

FIELD OF THE INVENTION

This invention relates to an electronic packaging and interconnection of a contact structure, and more particularly, to an electronic packaging and interconnection for mounting a contact structure on a probe card or equivalent thereof which is used to test semiconductor wafers, semiconductor chips, packaged semiconductor devices or printed circuit boards and the like with increased accuracy, density and speed.

BACKGROUND OF THE INVENTION

In testing high density and high speed electrical devices such as LSI and VLSI circuits, high performance probe contactors or test contactors must be used. The electronic packaging and interconnection of a contact structure of the present invention is not limited to the application of testing and burn-in of semiconductor wafers and die, but is inclusive of testing and burn-in of packaged semiconductor devices, printed circuit boards and the like. However, for the convenience of explanation, the present invention is described mainly with reference to a probe card to be used in semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables. The test head 100 and the substrate handler 400 are mechanically connected with one another by means of a manipulator 500 and a drive motor 510 shown FIG. 1. The semiconductor wafers to be tested are automatically provided to a test position of the test head by the substrate handler.

On the test head, the semiconductor wafer to be tested is provided with test signals generated by the semiconductor test system. The resultant output signals from the semiconductor wafer under test are transmitted to the semiconductor test system wherein they are compared with expected data to determine whether IC circuits on the semiconductor wafer function correctly.

The test head and the substrate handler are connected with an interface component 140 consisting of a performance board 120 which is a printed circuit board having electric circuit connections unique to a test head's electrical footprint, coaxial cables, pogo-pins and connectors. The test head 100 includes a large number of printed circuit boards 150 which correspond to the number of test channels. Each of the printed circuit boards has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

FIG. 2 shows, in more detail, a structure of the substrate handler 400, the test head 100 and the interface component 140 when testing a semiconductor wafer. As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. A probe card 170 is provided above the semiconductor wafer 300 to be tested. The probe card 170 has a large number of probe contactors (such as cantilevers or needles) 190 to contact with circuit terminals or contact targets in the IC circuit of the wafer 300 under test.

Electrical terminals or contact receptacles of the probe card 170 are electrically connected to the contact pins 141 provided on the frog ring 130. The contact pins 141 are also connected to the contact terminals 121 of the performance board 120 with coaxial cables 124 where each contact terminal 121 is connected to the printed circuit board 150 of the test head 100. Further, the printed circuit boards 150 are connected to the semiconductor test system through the cable 110 having several hundreds of inner cables.

Under this arrangement, the probe contactors 190 contact the surface of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps on the wafer 300. The ends of the cantilevers 190 are connected to wires 194 which are further connected to transmission lines (not shown) formed in the probe card 170. The transmission lines are connected to a plurality of electrodes 197 which contact the pogo pins 141 of FIG. 2.

Typically, the probe card 170 is structured by a multilayer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant of the polyimide, inductances, and capacitances of the signal within the probe card 170. Thus, the signal lines are impedance matched lines to achieve a high frequency transmission bandwidth to the wafer 300 providing current during steady state and high current peaks generated by the device's outputs switching. For removing noise, capacitors 193 and 195 are provided on the probe card between the power and ground planes.

An equivalent circuit of the probe card 170 is shown in FIG. 4 to explain the limitation of bandwidth in the conventional probe card technology. As shown in FIGS. 4A and 4B, the signal transmission line on the probe card 170 extends from the electrode 197, the strip (impedance matched) line 196, the wire 194 and the needle (cantilever) 190. Since the wire 194 and needle 190 are not impedance matched, these portions function as an inductor L in the high frequency band as shown in FIG. 4C. Because of the overall length of the wire 194 and needle 190 is around 20–30 mm, the significant frequency limitation is resulted in testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines.

Accordingly, the most widely used probe contactors as noted above are limited to the frequency bandwidth of approximately 200 MHz which is insufficient to test recent semiconductor devices. It is considered, in the industry, that the frequency bandwidth be of at least that equal to the tester's capability which is currently on the order of 1 GHz or higher, will be necessary in the near future. Further, it is desired in the industry that a probe card is capable of handling a large number of semiconductor devices, especially memories, such as 32 or more, in parallel (parallel test) to increase test throughput.

To meet the next generation test requirements noted above, the inventors of this application has provided a new concept of contact structure in the U.S. application Ser. No. 09/099,614 "Probe Contactor Formed by Photolithography Process" filed Jun. 19, 1998. The contact structure is formed on a silicon or dielectric substrate through a photolithography process. FIGS. 5 and 6 show the contact structure in the above noted application. In FIG. 5, all of the contact structures 30 are formed on a silicon substrate 20 through the same photolithography process. When the semiconductor wafer 300 under test moves upward, the contact structures 30 contact corresponding contact targets (electrodes or pads) 320 on the wafer 300.

The contact structure 30 on the silicon substrate 20 can be directly mounted on a probe card such as shown in FIG. 3, or molded in a package, such as a traditional IC package having leads, so that the package is mounted on a probe card. However, packaging and interconnection of the contact structure 30 with respect to the probe card or equivalent thereof is not described in the patent application.

SUMMARY OF THE INVENTION

Therefore, it is an object of the present invention to provide a packaging and interconnection of a contact structure with respect to a probe card or equivalent thereof to be used in testing a semiconductor wafer, packaged LSI and the like.

It is another object of the present invention to provide a packaging and interconnection of a contact structure with respect to a probe card or equivalent thereof to achieve a high speed and frequency operation in testing a semiconductor wafer, packaged LSI and the like.

It is a further object of the present invention to provide a packaging and interconnection of a contact structure with respect to a probe card or equivalent thereof wherein the packaging and interconnection is formed at an edge of the contact structure.

It is a further object of the present invention to provide a packaging and interconnection of a contact structure which is formed between a contact trace provided at an edge of the contact structure and an interconnect pad of a printed circuit board.

It is a further object of the present invention to provide a packaging and interconnection of a contact structure which is formed between a contact trace provided at an edge of the contact structure and a connector.

It is a further object of the present invention to provide a packaging and interconnection of a contact structure which is formed between a contact trace provided at an edge of the contact structure and an interconnect pad of a printed circuit board through a solder bump.

It is a further object of the present invention to provide a packaging and interconnection of a contact structure which is formed between a contact trace provided at an edge of the contact structure and an interconnect pad of a printed circuit board through a conductive polymer.

In the present invention, an electronic packaging and interconnection of a contact structure to be used in a probe card or equivalent thereof to test semiconductor wafers, semiconductor chips, packaged semiconductor devices or printed circuit boards and the like is established between a contact trace formed at an edge of the contact structure and various types of connection means on the probe card.

In one aspect of the present invention, a packaging and interconnection of a contact structure is comprised of: a contact structure made of conductive material and formed on a contact substrate through a photolithography process wherein the contact structure has a base portion vertically formed on the contact substrate, a horizontal portion, one end of which being formed on the base portion, and a contact portion vertically formed on another end of the horizontal portion; a contact trace formed on the contact substrate and electrically connected to the contact structure at one end, and the other end of the contact trace is extended toward an edge of the contact substrate; a printed circuit board (PCB) pad provided on a printed circuit board (PCB) substrate to be electrically connected with the other end of the contact trace; an elastomer provided under the contact substrate for allowing flexibility in the interconnection and packaging of the contact structure; and a support structure provided between the elastomer and the PCB substrate for supporting the contact structure, the contact substrate and the elastomer.

In another aspect of the present invention, a connector is provided to receive the other end of the contact trace to establish electrical connection therebetween. In a further aspect of the present invention, a conductive bump is provided between the other end of the contact trace and the PCB pad to establish electrical connection thereamong. In a further aspect of the present invention, a conductive polymer is provided between the other end of the contact trace and the PCB pad to establish electrical connection thereamong.

According to the present invention, the packaging and interconnection has a very high frequency bandwidth to meet the test requirements in the next generation semiconductor technology. The packaging and interconnection is able to mount the contact structure on a probe card or equivalent thereof by electrically connecting therewith through the edge of the contact structure. Moreover, because of a relatively small number of overall components to be assembled, the interconnection and packaging of the present invention can be fabricated with low cost and high reliability as well as high productivity.

BRIEF DESCRIPTION OF THE DRAWINGS

FIG. 3 is a bottom view showing an example of the probe card having an epoxy ring for mounting a plurality of cantilevers as probe contactors.

FIGS. 4A–4E are circuit diagrams showing equivalent circuits of the probe card of FIG. 3.

DETAILED DESCRIPTION OF THE PREFERRED EMBODIMENT

Figure 6A:
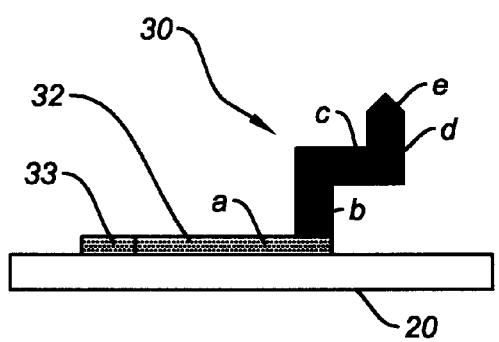
FIGS. 6A–6C are schematic diagrams showing examples of contact structure associated with the present invention formed on a silicon substrate.
Figure 6B:
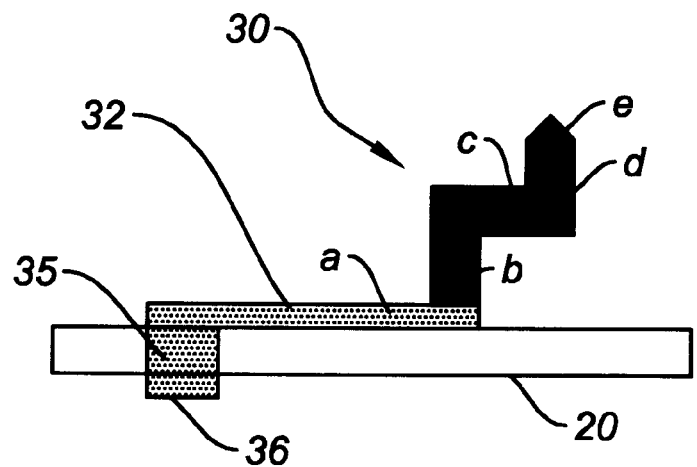
Figure 6C:
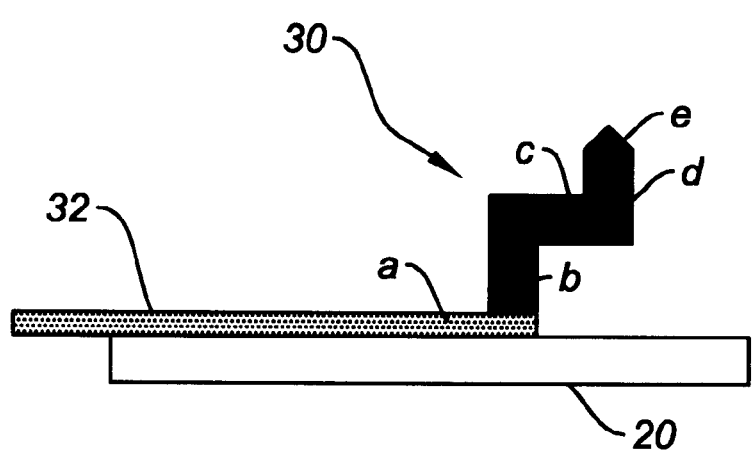

To establish a packaging and interconnection of a contact structure directly with a probe card or indirectly with a probe card through an IC package, examples of FIGS. 6A–6C show basic three types of electrical path extended from the contact structure to form such interconnections. FIG. 6A shows an example in which such an electrical connection is established at the top of the substrate. FIG. 6B shows an example in which an electrical connection is established at the bottom of the substrate while FIG. 6c shows an example in which an electrical connection is formed at the edge of the substrate. Almost any types of existing IC package design or probe card design can accommodate at least one of the interconnect types of FIGS. 6A–6C.

Each of FIGS. 6A–6C include a contact interconnect trace 32 also designated by a which is to establish electrical connection with a probe card or any intermediate member to a probe card. The contact structure 30 has vertical portions b and d and a horizontal beam c and a tip portion e. The tip portion e of the contact structure 30 is preferably sharpened to achieve a scrubbing effect when pressed against contact targets 320 such as shown in FIG. 3. The spring force of the horizontal beam c provides an appropriate contact force against the contact target 320. The inventors of this application have provided a detailed description of production process of the contact structure 30 and the contact interconnect trace 32 on the silicon substrate 20 in the above noted U.S. application Ser. No. 09/099,614.

In the present invention, the packaging and interconnection of a contact structure is directed to the type of structure having a contact trace at an edge (edge type contact trace) thereof as shown in FIG. 6C. Various embodiments of the present invention on the edge type packaging and interconnection will be described with reference to the drawings.

FIGS. 7–10 show a first embodiment of the present invention wherein the edge type contact trace is coupled to an interconnect pad provided on a printed circuit board. In the first example of FIG. 7, a contact structure 30 formed on a contact substrate 20 is electrically connected to a contact trace 32 which is the edge type contact trace noted above. Typically, the contact substrate 20 is a silicon substrate although other types of dielectric substrate, such as glass epoxy, polyimide, ceramic, and alumina substrates are also feasible. The contact trace 32 is connected at its end with a printed circuit board (PCB) interconnect pad 38 provided on a PCB substrate 62. At about the center of FIG. 7, the contact substrate 20 is mounted on the PCB substrate 62 through an elastomer 42 and a support structure 52. The contact substrate 20, the elastomer 42, the support structure 52 and the PCB substrate 62 are fixed with one another by, for example, an adhesive (not shown).

The electrical connection between the contact trace 32 and the PCB pad 38 will be established by various bonding technologies including thermosonic bonding, thermocompression bonding, and ultrasonic bonding technique. In another aspect, such an electrical connection will be established through a surface mount technology (SMT) such as using a screen printable solder paste. A soldering process is carried out based on the reflow characteristics of the solder paste and other solder materials well known in the art.

Figure 1:
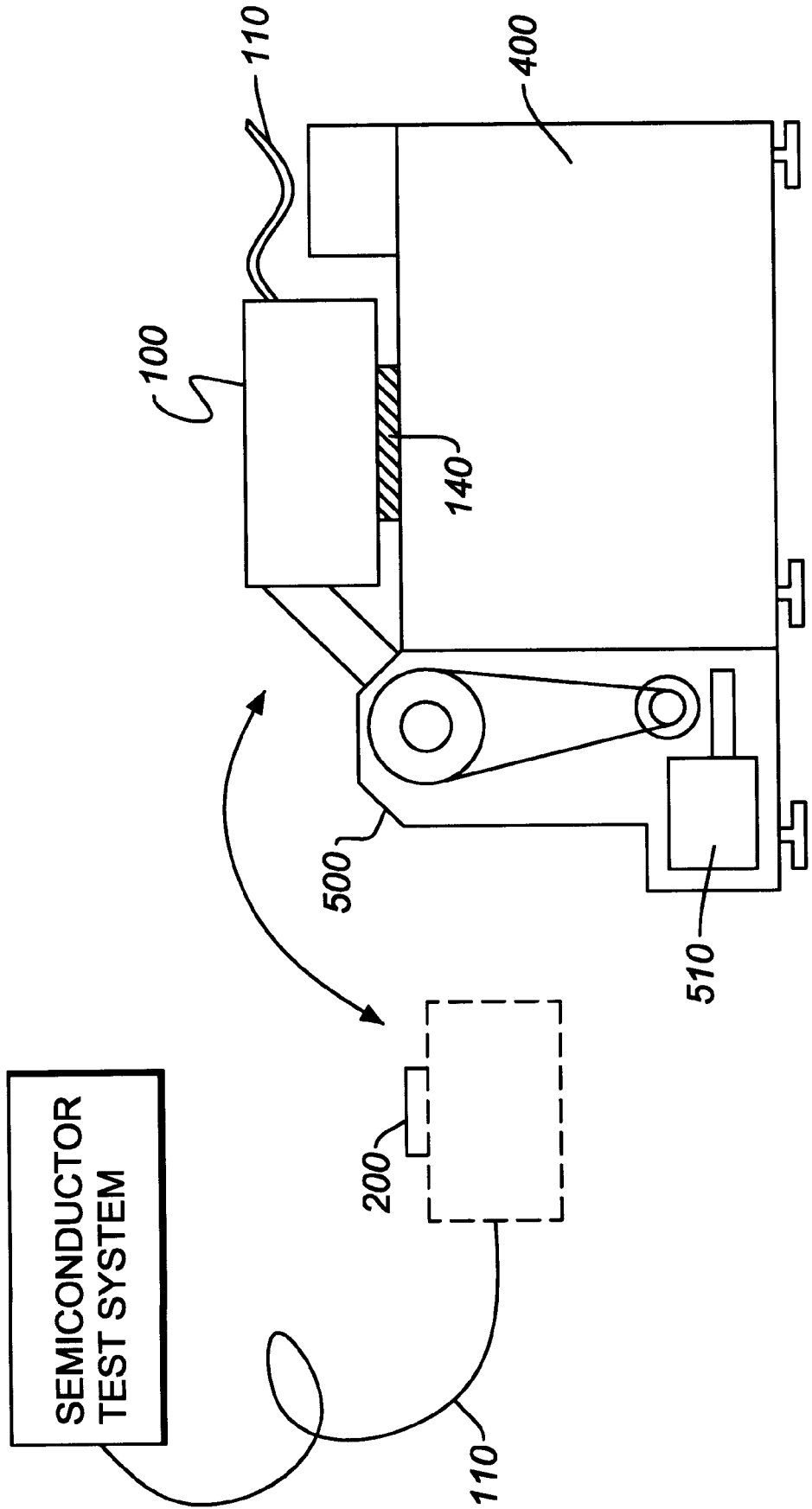
FIG. 1 is a schematic diagram showing a structural relationship between a substrate handler and a semiconductor test system having a test head.
Figure 2:
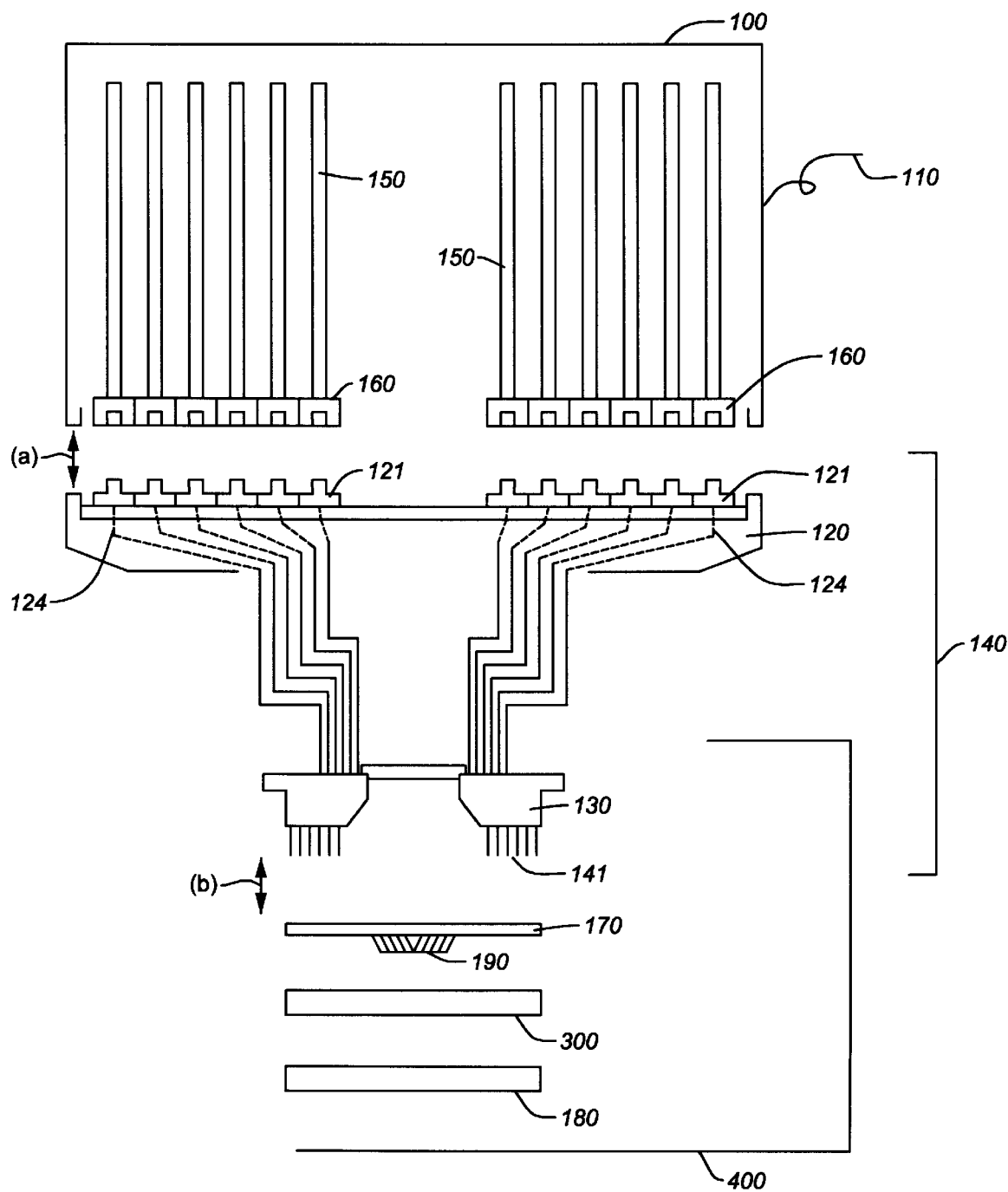
FIG. 2 is a schematic diagram showing an example of detailed structure for connecting the test head of the semiconductor test system to the substrate handler.
Figure 5:
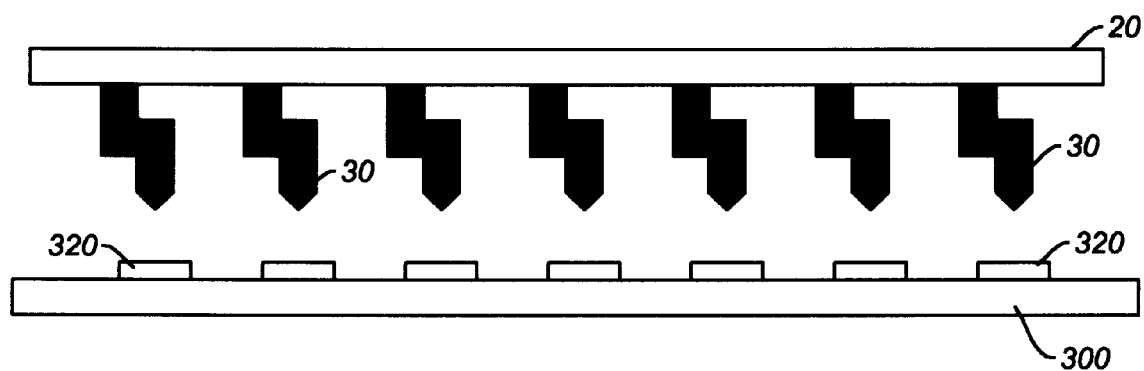
FIG. 5 is a schematic diagram showing contact structures associated with the present invention produced through a photolithography process.

The PCB substrate 62 itself may be a probe card such as shown in FIG. 3 or provided separately and mounted directly or indirectly on the probe card. In the former case, the PCB 62 may make direct contact with an interface of a test system such as an IC tester in a manner shown in FIG. 2. In the latter case, the PCB substrate 62 is pinned or in use of a conductive polymer for establishing an electrical contact to the next level of a contact mechanism on the probe card. Such types of electrical connection between the PCB substrate 62 and the probe card through pins or conductive polymer would allow for field repairability.

The PCB substrate 62 may be a multiple layer structure which is capable of providing high bandwidth signals, distributed high frequency capacitance and integrated high frequency chip capacitors for power supply decoupling as well as high pin counts (number of I/O pins and associated signal paths). An example of material of the PCB 62 is standard high performance glass epoxy resin. Another example of material is ceramics which is expected to minimize mismatch in coefficient of temperature expansion (CTE) rates during high temperature application such as a burn-in test of semiconductor wafers and packaged IC devices.

The support structure 52 is to establish a physical strength of the packaging and interconnection of the contact structure. The support structure 52 is made of, for example, ceramic, molded plastic or metal. The elastomer 42 is to establish flexibility in the packaging and interconnection of the present invention to overcome a potential planarization mechanism. The elastomer 42 also functions to absorb a mismatch in temperature expansion rates between the contact substrate 20 and the PCB substrate 62.

An example of length of the contact trace 32 is in the range from several ten micrometers to several hundred micrometers. Because of the short path length, the packaging interconnection of the present invention can be easily operable in a high frequency band such as several GHz or even higher. Moreover, because of a relatively small number of overall components to be assembled, the packaging and interconnection of the present invention can be fabricated with low cost and high reliability as well as high productivity.

Figure 7:
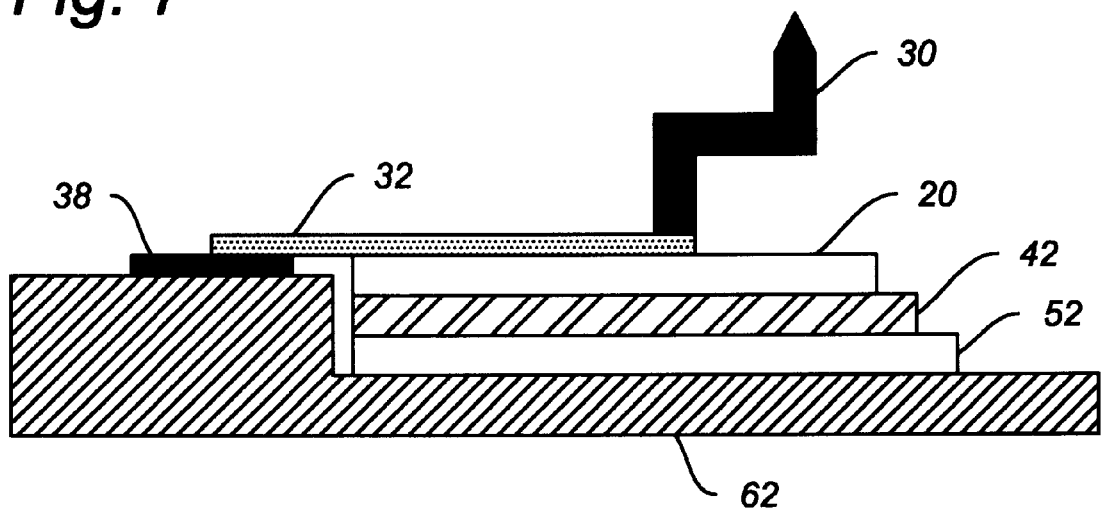
FIG. 7 is a schematic diagram showing a first embodiment of the present invention in which the packaging and interconnection is formed between a contact trace provided at an edge of the contact structure and an interconnect pad of a printed circuit board.
Figure 8:
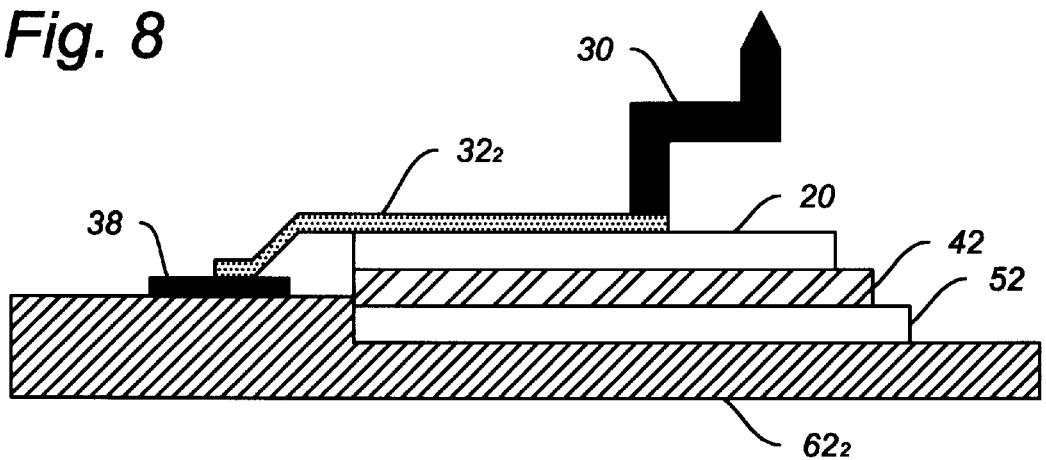
FIG. 8 is a schematic diagram showing a modified structure of the first embodiment of the present invention.

FIG. 8 shows another example of the first embodiment of the present invention. A contact trace $32_2$ is bent downward and is shaped like a gull-wing which is similar to the standard "gull-wing lead" used in a surface mount technology. Because of the gull-wing of the contact trace $32_2$, a vertical position of the PCB interconnect pad 38 on a PCB substrate $62_2$ is lower than that of FIG. 7. In other words, the thickness of the left portion of the PCB substrate $62_2$ is smaller than that of the PCB substrate 62 of FIG. 7. Thus, the example of FIG. 8 provides an additional clearance in a vertical dimension over the contact portion between the PCB pad 38 and the contact trace $32_2$.

The lead form of the contact trace $32_2$ noted above (downward bent, gull-wing lead) may require special tooling to produce the same. Since a large number of interconnection between the contact trace and the PCB pad will be used in the application such as semiconductor testing, several hundred connections, such tooling may be standardized for a multiple of contact traces with given pitch.

The electrical connection between the contact trace $32_2$ and the PCB pad 38 will be established by a surface mount technology (SMT) such as using a screen printable solder paste as well as various other bonding technologies including thermosonic bonding, thermocompression bonding, and ultrasonic bonding technique. Because of the significantly small sizes of the components and signal path lengths involved in the contact structure 30 and contact trace $32_2$, the example of FIG. 8 can operate at a very high frequency band, such as several GHz. Moreover, because of the small number and simple structure of components to be assembled, the interconnection and packaging of the present invention can be fabricated with low cost and high reliability as well as high productivity.

Figure 9:
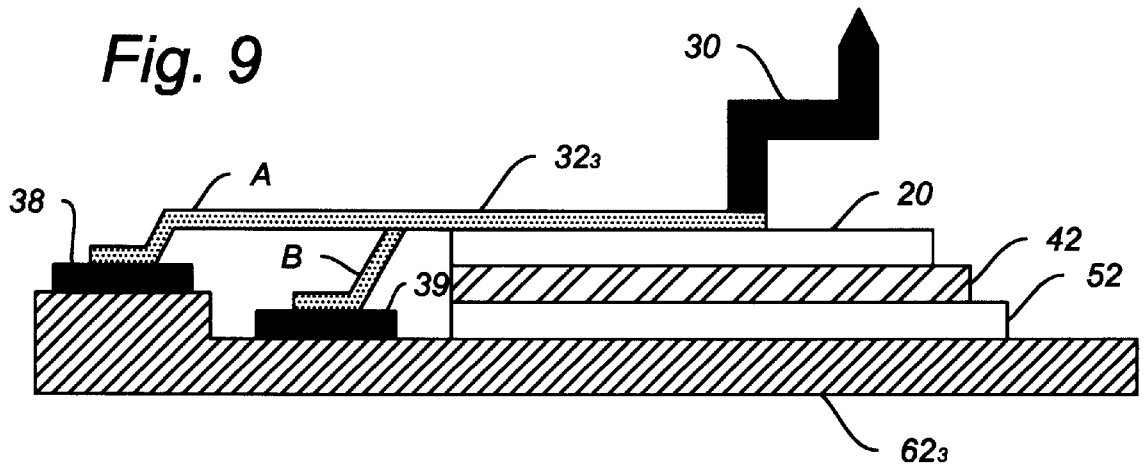
FIG. 9 is a schematic diagram showing another modified structure of the first embodiment of the present invention.

FIG. 9 shows a further example of the first embodiment of the present invention. In this example, two gull-wing leads A and B are provided to a contact trace $32_3$ connected to the contact structure 30. The gull-wing lead A is provided in an upper and outer position of FIG. 9 than the gull-wing lead B. The gull-wing lead A is connected to a PCB pad 38 and the gull-wing B lead is connected to a PCB pad 39. To accommodate the PCB pads 38 and 39 thereon, a PCB substrate $62_3$ is arranged to have an edge portion having a larger thickness, i.e., a step, to mount the PCB pad 38, and an inner portion adjacent to the edge portion having a smaller thickness to mount the PCB pad 39.

The lead form of the contact trace $32_3$ noted above (downward bent, gull-wing lead) may require special tooling to produce the same. Such tooling may be standardized for a multiple of contact traces with a given pitch. The electrical connection between the contact trace $32_3$ and the PCB pads 38 and 39 will be established by the surface mount technology such as using the screen printable solder paste as well as various other bonding technologies including thermosonic bonding, thermocompression bonding, and ultrasonic bonding technique.

The structure of contact trace $32_3$ having the tiered gull-wing leads A and B establish a fan out in the vertical dimension. This is useful in distributing a signal or power to two or more paths. Another advantage of the fan out is to increase the number of contact pads, i.e., to decrease the effective pitch (distance) between the contact pads. Similar to the example of FIG. 8, the contact trace $32_3$ of FIG. 9 provides an additional clearance in a vertical dimension above the contact portions between contact trace $32_3$ and the PCB pads 38 and 39.

Figure 10:
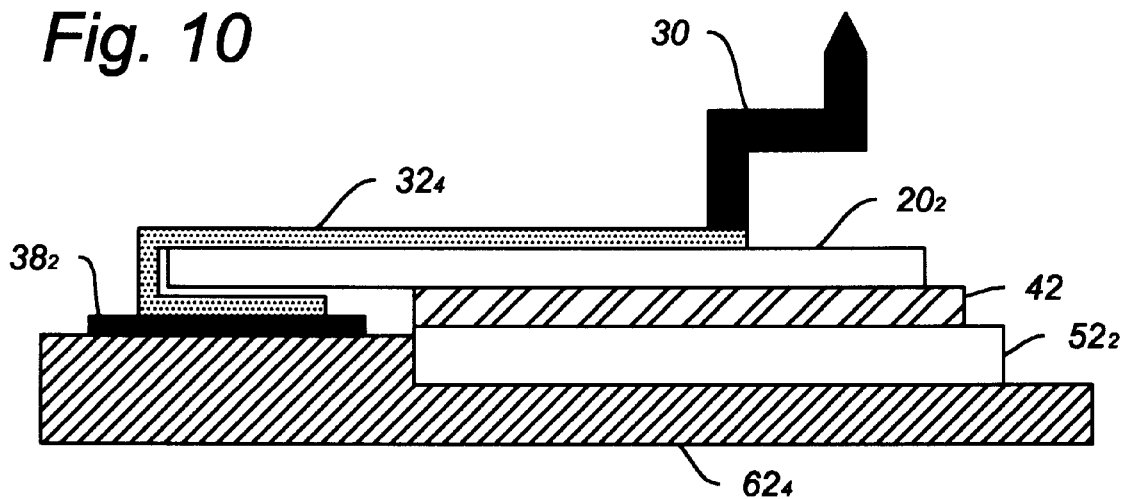
FIG. 10 is a schematic diagram showing a further modified structure of the first embodiment of the present invention.

FIG. 10 shows a further example of the first embodiment of the present invention. In this example, a contact trace $32_4$ is shaped like a J-lead commonly used in the surface mount technology. The J-lead is formed at the edge of a contact substrate $20_2$ in a manner to surround the substrate edge. The bottom surface of the contact trace $32_4$ (J-lead) is connected to a PCB pad $38_2$ on a PCB substrate $62_4$. As shown in FIG. 10, the shapes of a support structure $52_2$ and the PCB substrate $62_4$ are slightly different from that of the previous examples to meat the J-lead shape of the contact trace $32_4$.

The lead form of the contact trace $32_4$ noted above (J-lead) may require special tooling to produce the same. Such tooling may be standardized for a multiple of contact traces with a given pitch. The electrical connection between the contact trace $32_4$ and the PCB pad $38_2$ will be established by the SMT technology such as using the screen printable solder paste as well as various other bonding technologies including thermosonic bonding, thermocompression bonding, ultrasonic bonding technique and the like.

The structure of the contact trace $32_4$ having the J-lead can establish an improved physical strength because a large portion of which is supported by the contact substrate $20_2$. The further advantage of this example is that the length of the contact trace $32_4$ is about the same as that of the contact substrate $20_2$. In other words, the lead form and the attachment to the PCB substrate in FIG. 10 does not consume any additional horizontal area than that consumed by the contact substrate $20_2$.

Figure 11:
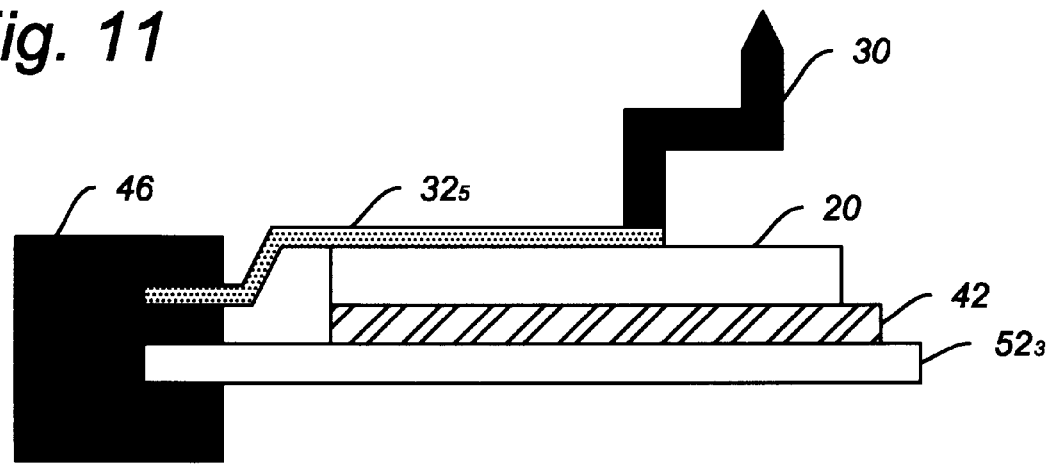
FIG. 11 is a schematic diagram showing a second embodiment of the present invention in which the packaging and interconnection is formed between a contact trace provided at an edge of the contact structure and a connector.
Figure 12:
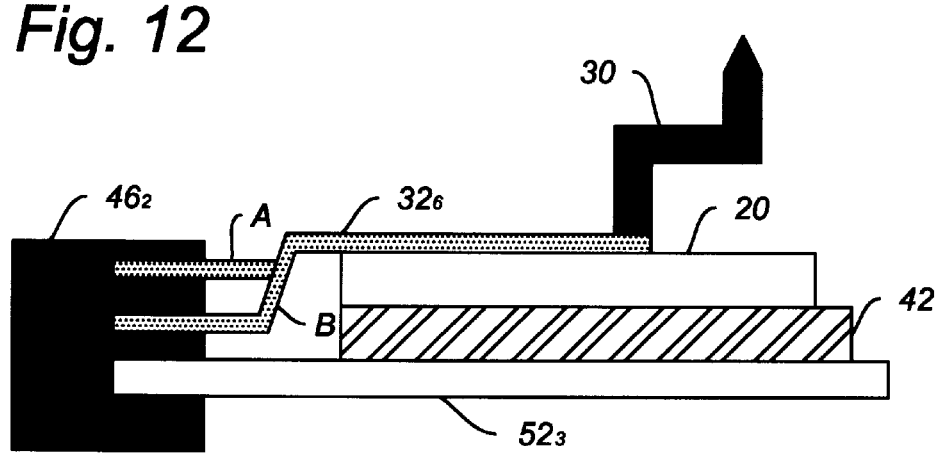
FIG. 12 is a schematic diagram showing a modified structure of the second embodiment of the present invention.

FIGS. 11 and 12 show a second embodiment of the present invention wherein the edge type contact trace is coupled to a connector provided on a printed circuit board or other structure. In the example of FIG. 11, a contact trace $32_5$ is formed on a contact substrate 20 and is connected to a connector 46 provided on a support structure $52_3$. Typically, the contact substrate 20 is a silicon substrate although other types of dielectric substrate, such as glass epoxy, polyimide, ceramic, and alumina substrates are also feasible.

In this example, the contact trace $32_5$ has a shape similar to the gull-wing widely used in the surface mount technology and incorporated in the example of FIG. 8. At about the center of FIG. 11, the contact substrate 20 is mounted on the support structure $52_3$ through an elastomer 42. The contact substrate 20, the elastomer 42 and the support structure $52_3$ are attached with one another by, for example, an adhesive (not shown).

The connector 46 may be mechanically fixed to the support structure $52_3$ through an attachment mechanism (not shown). The end of the contact trace $32_5$ is inserted in a receptacle (not shown) of the connector 46. As is well known in the art, such a receptacle has a spring mechanism to provide a sufficient contact force when receiving the end of the contact trace $32_5$ therein. Also well known in the art, an inner surface of such a receptacle is provided with conductive metal such as gold, silver, palladium or nickel.

The connector 46 may be integrated with straight or right angle pins, which may be connected to the receptacle noted above, for direct connection to a printed circuit board (PCB). A PCB to mount the connector 46 thereon can be either solid or flexible. As is known in the art, a flexible PCB is formed on a flexible base material and has flat cables thereon. Alternatively, the connector 46 may be integrated with a coaxial cable assembly in which a receptacle is attached to an inner conductor of the coaxial cable for receiving the contact trace $32_5$ therein. The connection between the connector 46 and the contact trace $32_2$ or the support structure $52_3$ is not a permanent attachment method, allowing for field replacement and repairability of the contact portion.

Typically, the contact substrate 20 is a silicon substrate although other types of substrate, such as glass epoxy, polyimide, ceramic, and alumina substrates are also feasible. The support structure $52_3$ is to establish a physical strength of the packaging and interconnection of the contact structure. The support structure $52_3$ is made of, for example, ceramic, molded plastic or metal. The elastomer 42 is to establish flexibility in the interconnection and packaging of the present invention to overcome a potential planarization mechanism. The elastomer 42 also functions to absorb a mismatch in temperature expansion rates between the contact substrate 20 and a PCB substrate to mount the connector 46 thereon.

An example of length of the contact trace $32_5$ is in the range from several ten micrometers to several hundred micrometers. Because of the short path length, the interconnection and packaging of the present invention can be easily operable in a high frequency band such as several GHz or even higher. Moreover, because of the lower total number of components to be assembled, the packaging and interconnection of the present invention can be fabricated with low cost and high reliability as well as high productivity. The gull-wing shaped contact trace $32_5$ may require special tooling in the production process, which may be standardized for a multiple of contact traces with a given pitch. The shape of the contact trace $32_5$ provides for additional top side clearance in the vertical dimension.

FIG. 12 shows another example of the second embodiment of the present invention. In this example, two leads A and B are provided to a contact trace $32_6$ connected to the contact structure 30. The leads A and B are gull-wing shaped similar to the example of FIG. 11. The lead A is positioned over the lead B as shown in FIG. 9. The leads A and B are inserted in corresponding receptacles (not shown) of a connector $46_2$ to establish the electrical connection therebetween. The connector $46_2$ is mechanically attached on a support structure $52_3$.

The lead form of the contact trace $32_6$ noted above (downward bent, gull-wing lead) may require special tooling to produce the same. Such tooling may be standardized for a multiple of contact traces with a given pitch. The structure of contact trace $32_6$ having the tiered gull-wing leads A and B can establish a fan out in the vertical dimension. This is useful in distributing a signal or power to two or more conductive paths. Other advantage is to increase the number of contact pads, i.e., to decrease the effective pitch (distance) between the contact pads. Similar to the example of FIG. 11, the contact trace $32_6$ of FIG. 12 provides an additional clearance in a vertical dimension over the contact trace $32_6$ and the connector $46_2$.

Figure 13:
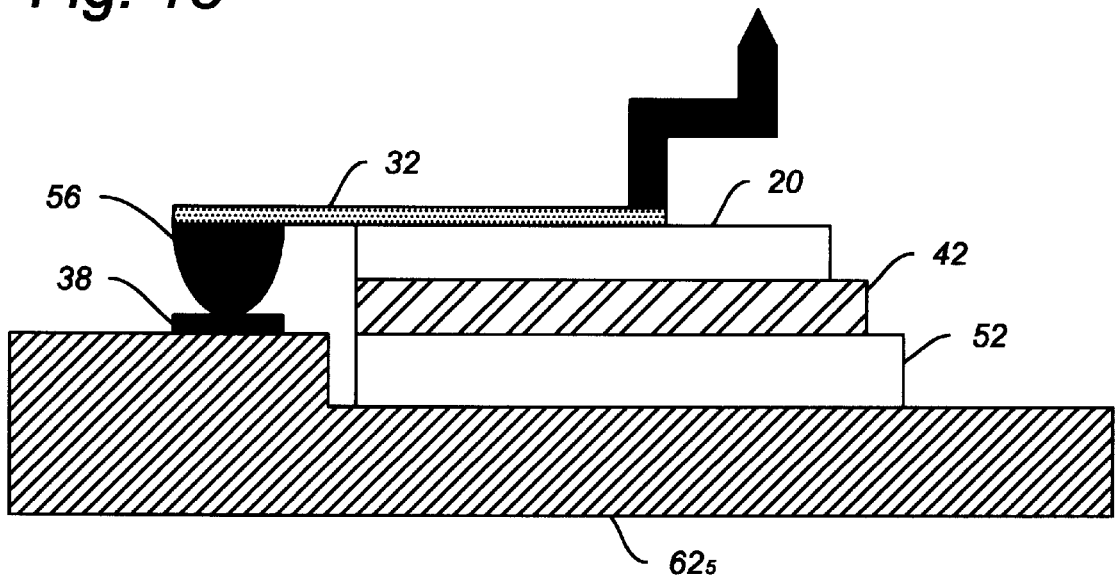
FIG. 13 is a schematic diagram showing a third embodiment of the present invention in which the packaging and interconnection is formed between a contact trace provided at an edge of the contact structure and an interconnect pad of a printed circuit board by means of a conductive bump.

FIGS. 13–16 show a third embodiment of the present invention wherein the edge type contact trace is coupled to a pad provided on a printed circuit board through a conductive bump. In the example of FIG. 13, a contact trace 32 is formed on a contact substrate 20. Typically, the contact substrate 20 is a silicon substrate although other types of dielectric substrate, such as glass epoxy, polyimide, ceramic, and alumina substrates are also feasible. The contact trace 32 is connected to a PCB (print circuit board) pad 38 provided on a PCB substrate $62_5$ through a conductive bump 56.

In this example, the contact trace 32 has the same straight shape as that shown in the example of FIG. 7. At about the center of FIG. 13, the contact substrate 20 is mounted on the PCB substrate $62_5$, through a support structure 52 and an elastomer 42. The contact substrate 20, the elastomer 42, the support structure 52, and the PCB substrate $62_5$ are attached with one another by, for example, an adhesive (not shown).

By the application of the heat, the conductive bump 56 is reflowed onto the PCB pad 38 for attachment between the contact trace 32 and the PCB pad 38. An example of the conductive bump 56 is a solder bump used in a standard solder ball technology. Another example of the conductive bump 56 is a fluxless solder ball used in a plasma-assisted dry soldering technology.

Further examples of the conductive bump 56 are a conductive polymer bump and a compliant bump which involve the use of polymer in the bump. This helps in minimizing planarization problems or CTE (coefficient of temperature expansion) mismatches in the packaging and interconnection. There is no reflowing of metal, which prevents bridging between contact points. The conductive polymer bump is made of a screen printable conductive adhesive. The compliant bump is a polymer core bump with a metal coating. The polymer is typically plated with gold and is elastically compressible. Still further example of the conductive bump 56 is a bump used in a controlled collapse chip connection technology in which solder balls are formed by an evaporation process.

The PCB substrate $62_5$ itself may be a probe card such as shown in FIG. 3 or provided separately and mounted directly or indirectly on the probe card. In the former case, the PCB substrate $62_5$ may make direct contact with an interface of a test system such as an IC tester in the manner shown in FIG. 2. In the latter case, the PCB substrate $62_5$ is pinned or in use of a conductive polymer for establishing an electrical contact to the next level. Such types of electrical connection between the PCB substrate $62_5$ and the probe card through pins or conductive polymer would allow for field repairability.

The PCB substrate $62_5$ may be a multiple layer structure which is capable of providing high bandwidth signals, distributed high frequency capacitance and integrated high frequency chip capacitors for power supply decoupling as well as high pin counts (number of I/O pins and associated signal paths). An example of material of the PCB substrate $62_5$ is standard high performance glass epoxy resin. Another example of the material is ceramics which is expected to minimize mismatch in coefficient of temperature expansion (CTE) rates during high temperature application such as a burn-in test of semiconductor wafers and packaged IC devices.

The support structure 52 is to establish a physical strength of the packaging and interconnection of the contact structure. The support structure 52 is made of, for example, ceramic, molded plastic or metal. The elastomer 42 is to establish flexibility in the packaging and interconnection of the present invention to overcome a potential planarization mechanism. The elastomer 42 also functions to absorb a mismatch in temperature expansion rates between the contact substrate 20 and the PCB substrate $62_5$.

An example of length of the contact trace 32 is in the range from several ten micrometers to several hundred micrometers. Because of the short path length, the interconnection and packaging of the present invention can be easily operable in a high frequency band such as several GHz or even higher. Moreover, because of the lower total number of components to be assembled, the packaging and interconnection of the present invention can be fabricated with low cost and high reliability as well as high productivity.

Figure 14:
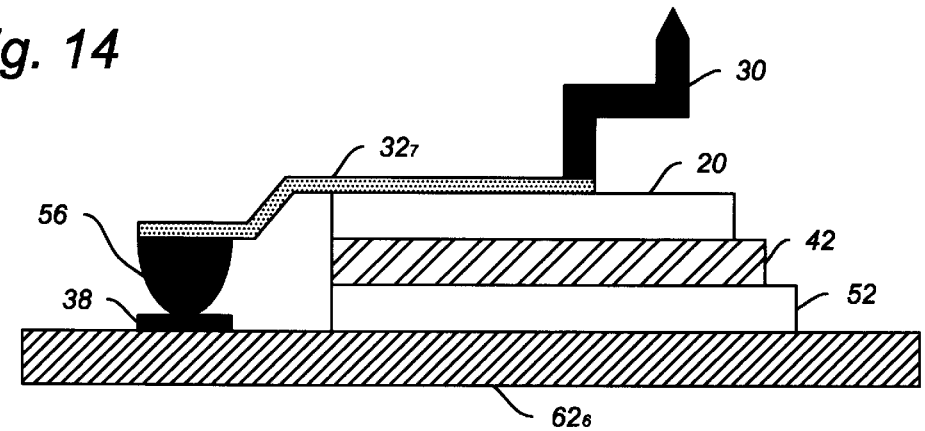
FIG. 14 is a schematic diagram showing a modified structure of the third embodiment of the present invention.

FIG. 14 shows another example of the third embodiment of the present invention. A contact trace $32_7$ is bent downward and is shaped like a gull-wing which is similar to the standard "gull-wing lead" used in a surface mount technology and incorporated in the examples of FIGS. 8 and 11. Because of the gull-wing shape of the contact trace $32_7$, a PCB interconnect pad 38 on a PCB substrate $62_6$ is positioned lower than that of FIG. 13. In this example, the PCB substrate $62_6$ has a planer surface throughout and has no step thereon. Thus, this example provides an additional clearance in the vertical dimension over the contact portion between the PCB pad 38 and the contact trace $32_7$.

The lead form of the contact trace $32_7$ noted above (downward bent, gull-wing lead) may require special tooling to produce the same. Such tooling may be standardized for a multiple of contact traces with given pitch. Because of the extremely small sizes of the components therein and short path length of the contact structure 30 and contact trace $32_7$, the example of FIG. 14 can operate at a high frequency band such as several GHz. Moreover, because of the small number and simple structure of components to be assembled, the packaging and interconnection of the present invention can be fabricated with low cost and high reliability as well as high productivity.

Figure 15:
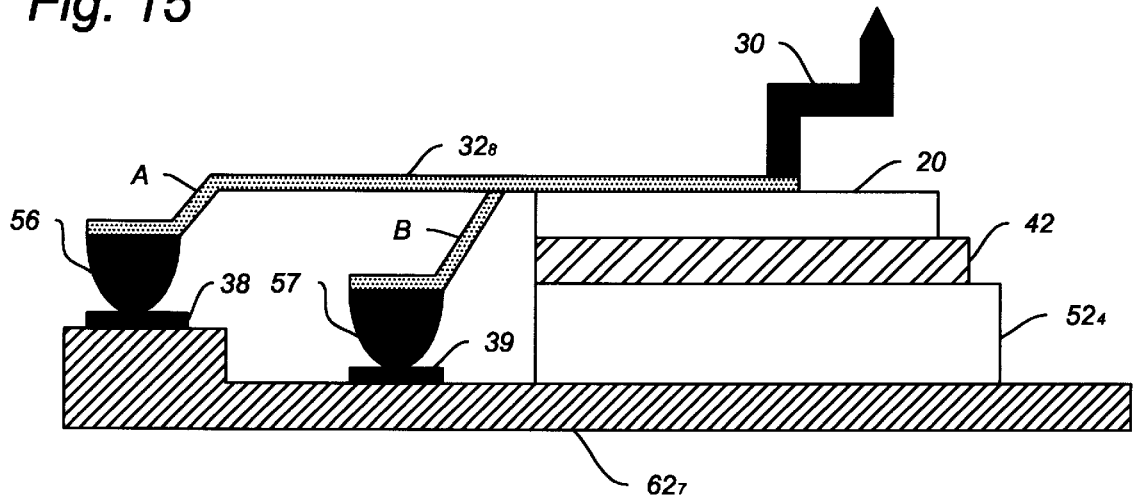
FIG. 15 is a schematic diagram showing another modified structure of the third embodiment of the present invention.

FIG. 15 shows a further example of the third embodiment of the present invention. In this example, two gull-wing leads A and B are provided to a contact trace $32_8$ connected to the contact structure 30. The gull-wing lead A is provided in an upper and outer position of FIG. 15 than the gull-wing lead B. The gull-wing lead A is connected to a PCB interconnect pad 38 through a conductive bump 56 and the gull-wing lead B is connected to a PCB interconnect pad 39 through a conductive bump 57. To accommodate the PCB interconnect pads 38 and 39 thereon, a PCB substrate $62_7$ is arranged to have an edge portion having a larger thickness, i.e., a step, to mount the PCB pad 38 thereon, and an inner portion adjacent to the edge portion having a smaller thickness to mount the PCB pad 39 thereon.

The lead form of the contact trace $32_8$ noted above (downward bent, gull-wing lead) may require special tooling to produce the same. Such tooling may be standardized for a multiple of contact traces with a given pitch. The structure of the contact trace $32_8$ having the tiered gull-wing leads A and B can establish a fan out in the vertical dimension. This is useful in distributing a signal or power to two or more paths. Other advantage is to increase the number of contact pads, i.e., to decrease the effective pitch (distance) between the contact pads. Similar to the example of FIG. 14, the contact trace $32_8$ of FIG. 15 provides an additional clearance in the vertical dimension over the contact portions formed by the contact trace $32_8$ and the PCB pads 38 and 39.

Figure 16:
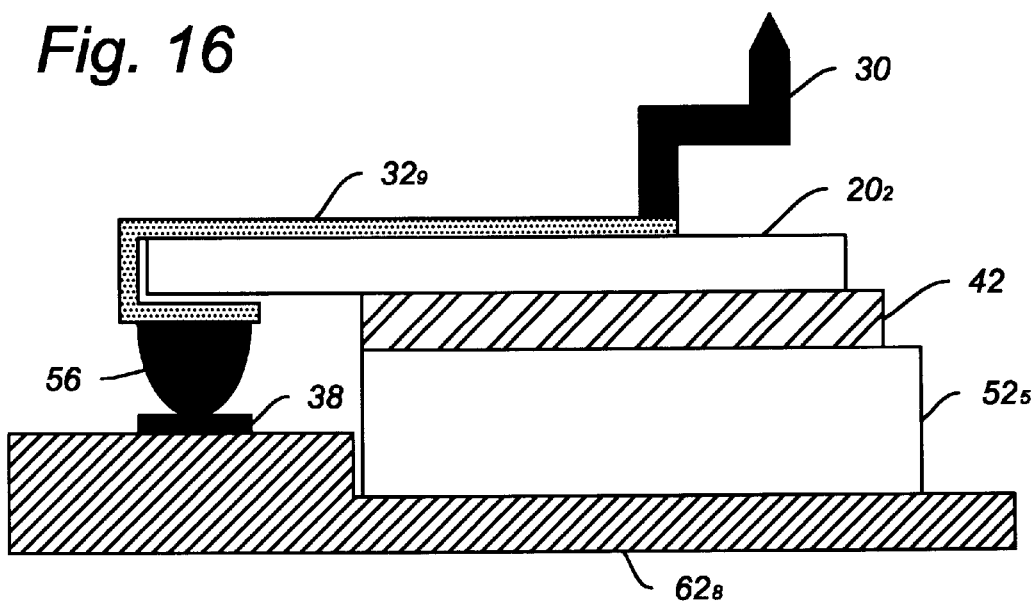
FIG. 16 is a schematic diagram showing a further modified structure of the third embodiment of the present invention.

FIG. 16 shows a further example of the third embodiment of the present invention. In this example, a contact trace $32_9$ is shaped like a J-lead commonly used in the surface mount technology. The J-lead is formed at the edge of a contact substrate $20_2$ in a manner to surround the edge of the substrate. The bottom surface of the contact trace $32_9$ (J-lead) is connected to a PCB pad 38 on a PCB substrate $62_8$ through a conductive bump 56. The shapes of a support structure $52_5$ and the PCB substrate $62_8$ are slightly different from that of the previous examples to meat the shape of the contact trace $32_9$. The lead form of the contact trace $32_9$ noted above (J-lead) may require special tooling to produce the same. Such tooling may be standardized for a multiple of contact traces with a given pitch.

The structure of contact trace $32_9$ having the J-lead can establish an improved physical strength because a large portion of which is supported by the contact substrate $20_2$. The further advantage of this example is that the length of the contact trace $32_9$ is about the same as that of the contact substrate $20_2$. In other words, the lead form and the attachment to the PCB substrate in FIG. 16 does not consume any additional horizontal area than that consumed by the contact substrate $20_2$.

Figure 17:
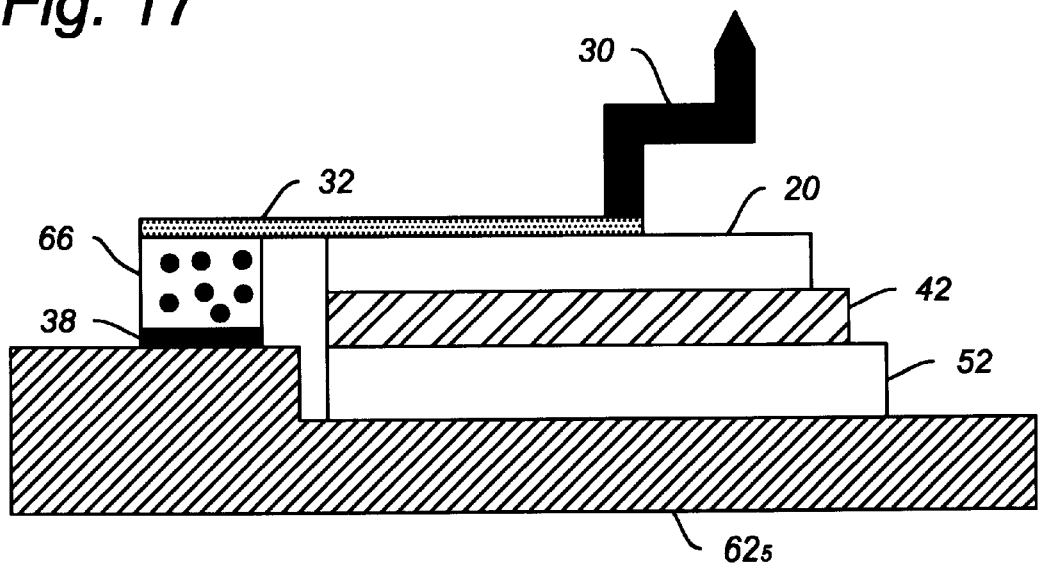
FIG. 17 is a schematic diagram showing a fourth embodiment of the present invention in which the packaging and interconnection is formed between a contact trace provided at an edge of the contact structure and an interconnect pad of a printed circuit board by means of a conductive polymer.

FIGS. 17–20 show a fourth embodiment of the present invention wherein the edge type contact trace is coupled to a pad provided on a printed circuit board through a conductive polymer. In the example of FIG. 17, a contact trace 32 is formed on a contact substrate 20 and is connected to a PCB (print circuit board) pad 38 provided on a PCB substrate $62_5$ through a conductive polymer 66. Typically, the contact substrate 20 is a silicon substrate although other types of dielectric substrate, such as glass epoxy, polyimide, ceramic, and alumina substrates are also feasible.

In this example, the contact trace 32 has the same straight shape as that shown in the example of FIGS. 7 and 13. At about the center of FIG. 17, the contact substrate 20 is mounted on the PCB substrate $62_5$ through a support structure 52 and an elastomer 42. The contact substrate 20, the elastomer 42, the support structure 52, and the PCB substrate $62_5$ are attached with one another by, for example, an adhesive (not shown).

Most conductive polymers are designed to be conductive between the mating electrodes normally in vertical or angled directions and not conductive in the horizontal direction. An example of the conductive polymer 66 is a conductive elastomer which is filled with conductive wire that extends beyond the surface of the elastomer.

Various other examples of the conductive polymer 66 are possible such as an anisotropic conductive adhesive, anisotropic conductive film, anisotropic conductive paste, and anisotropic conductive particles. The anisotropic conductive adhesive is filled with conductive particles that do not touch each other. The conductive path is formed by pressing the adhesive between the two electrodes at a specific location. The anisotropic conductive film is a thin dielectric resin filled with conductive particles that do not touch each other. The conductive path is formed by pressing the film between the two electrodes at a specific location.

The anisotropic conductive paste is a screen printable paste which is filled with conductive particles that do not touch each other. The conductive path is formed by pressing the paste between the two electrodes at a specific location. The anisotropic conductive particle is a thin dielectric resin filled with conductive particles coated with a very thin layer of dielectric material to improve isolation. The conductive path is formed by pressing the particle with enough force to explode the dielectric coating on the particles, between the two electrodes at a specific location.

The PCB substrate $62_5$ itself may be a probe card such as shown in FIG. 3 or provided separately and mounted directly or indirectly on the probe card. In the former case, the PCB substrate $62_5$ may make direct contact with an interface of a test system such as an IC tester in the manner shown in FIG. 2. In the latter case, the PCB substrate $62_5$ is pinned or in use of a conductive polymer for establishing an electrical contact to the next level. Such types of electrical connection between the PCB substrate $62_5$ and the probe card through pins or conductive polymer would allow for field repairability.

The PCB substrate $62_5$ may be a multiple layer structure which is capable of providing high bandwidth signals, distributed high frequency capacitance and integrated high frequency chip capacitors for power supply decoupling as well as high pin counts (number of I/O pins and associated signal paths). An example of material of the PCB substrate $62_5$ is standard high performance glass epoxy resin. Another example of material is ceramics which is expected to minimize mismatch in coefficient of temperature expansion (CTE) rates during high temperature application such as a burn-in test of semiconductor wafers and packaged IC devices.

The support structure 52 is to establish a physical strength of the packaging and interconnection of the contact structure. The support structure 52 is made of, for example, ceramic, molded plastic or metal. The elastomer 42 is to establish flexibility in the packaging and interconnection of the present invention to overcome a potential planarization mechanism. The elastomer 42 also functions to absorb a mismatch in temperature expansion rates between the contact substrate 20 and the PCB substrate $62_5$.

An example of length of the contact trace 32 is from several ten micrometers to several hundred micrometers. Because of the short path length, the packaging and interconnection of the present invention can be easily operable in a high frequency band such as several GHz or even higher. Moreover, because of the lower total number of components to be assembled, the interconnection and packaging of the present invention can be fabricated with low cost and high reliability as well as high productivity.

Figure 18:
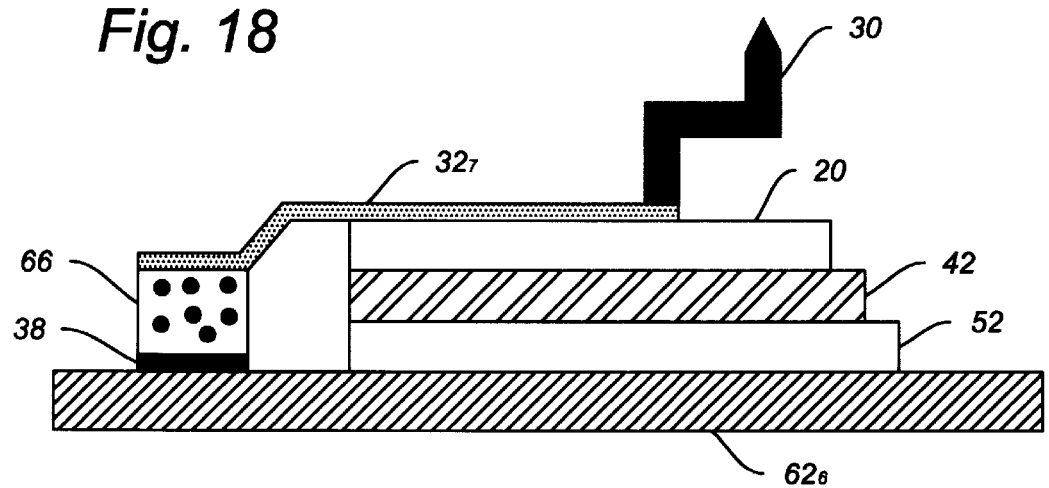
FIG. 18 is a schematic diagram showing a modified structure of the fourth embodiment of the present invention.

FIG. 18 shows another example of the fourth embodiment of the present invention. A contact trace $32_7$ is bent downward and is shaped like a gull-wing which is similar to the standard "gull-wing lead" used in a surface mount technology and incorporated in the examples of FIGS. 8, 11 and 14. Because of the gull-wing shape of the contact trace $32_7$, a PCB interconnect pad 38 on a PCB substrate $62_6$ is positioned lower than that of FIG. 17. In this example, the PCB substrate $62_6$ has a planer surface throughout and has no step thereon. Thus, the example of FIG. 18 provides an additional clearance in a vertical dimension over the contact portion among the PCB interconnect pad 38, the conductive polymer 66, and the contact trace $32_7$.

The lead form of the contact trace $32_7$ noted above (downward bent, gull-wing lead) may require special tooling to produce the same. Such tooling may be standardized for a multiple of contact traces with given pitch. Because of the extremely small sizes of the components therein and short path length of the contact structure 30 and contact trace $32_7$, the example of FIG. 18 can operate at a high frequency band. Moreover, because of the small number and simple structure of components to be assembled, the interconnection and packaging of the present invention can be fabricated with low cost and high reliability as well as high productivity.

Figure 19:
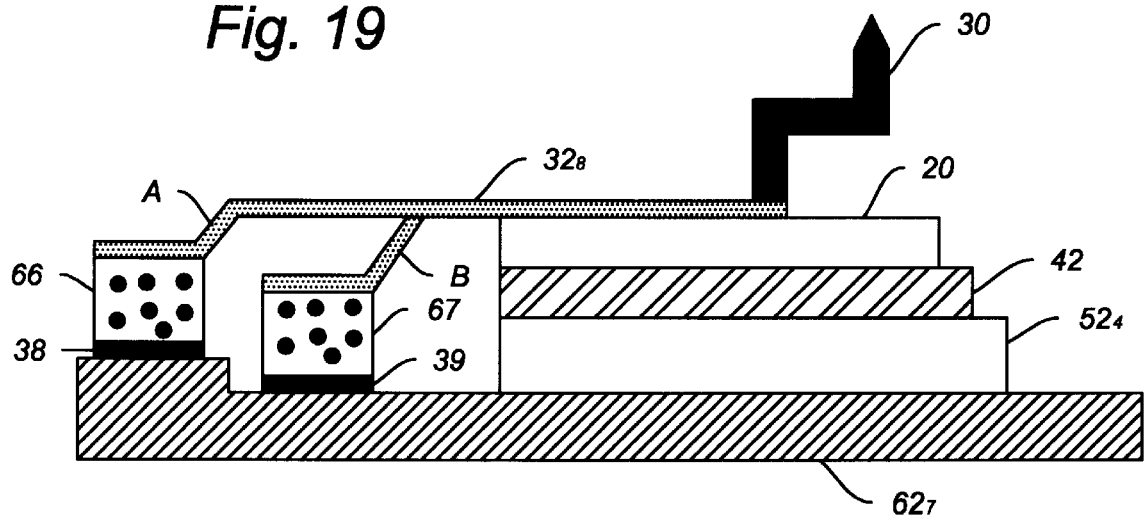
FIG. 19 is a schematic diagram showing another modified structure of the fourth embodiment of the present invention.

FIG. 19 shows a further example of the fourth embodiment of the present invention. In this example, two gull-wing leads A and B are provided to a contact trace $32_8$ connected to the contact structure 30. The gull-wing lead A is provided in an upper and outer position of FIG. 15 than the gull-wing lead B. The gull-wing lead A is connected to a PCB interconnect pad 38 through a conductive polymer 66 and the gull-wing lead B is connected to a PCB interconnect pad 39 through the conductive polymer 67. To accommodate the PCB interconnect pads 38 and 39 thereon, a PCB substrate $62_7$ is arranged to have an edge portion having a larger thickness, i.e., a step, to mount the PCB pad 38 thereon and an inner portion adjacent to the edge portion having a smaller thickness to mount the PCB pad 39 thereon.

The lead form of the contact trace $32_8$ noted above (downward bent, gull-wing lead) may require special tooling to produce the same. Such tooling may be standardized for a multiple of contact traces with a given pitch. The structure of contact trace $32_8$ having the tiered gull-wing leads A and B can establish a fan out in the vertical dimension. This is useful in distributing a signal or power to two or more paths. Other advantage of the fan out is to increase the number of contact pads, i.e., to decrease the effective pitch (distance) between the contact pads. Similar to the example of FIG. 18, the contact trace $32_8$ of FIG. 19 provides an additional clearance in the vertical dimension over the contact portions formed between contact trace $32_8$ and the PCB pads 38 and 39.

Figure 20:
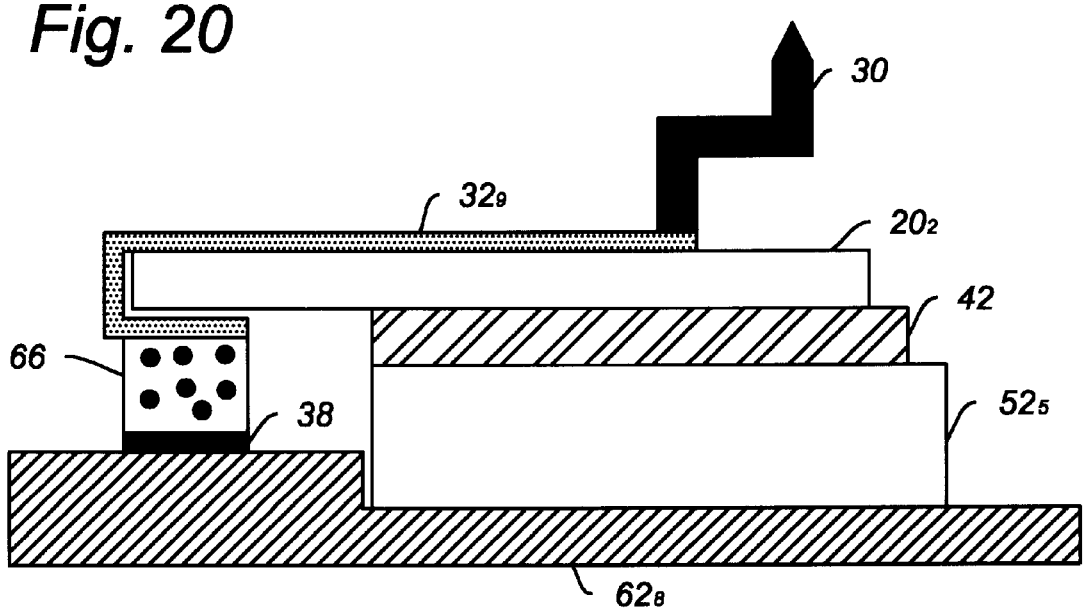
FIG. 20 is a schematic diagram showing a further modified structure of the fourth embodiment of the present invention.

FIG. 20 shows a further example of the fourth embodiment of the present invention. In this example, a contact trace $32_9$ is shaped like a J-lead commonly used in the surface mount technology. The J-lead is formed at the edge of a contact substrate $20_2$ in a manner to surround the edge thereof. The bottom surface of the contact trace $32_9$ (J-lead) is connected to a PCB interconnect pad 38 on a PCB substrate $62_8$ through the conductive polymer 66. The shapes of a support structure $52_5$ and the PCB substrate $62_8$ are slightly different from that of the previous examples to meat the shape of the contact trace $32_9$.

The lead form of the contact trace $32_9$ noted above (J-lead) may require special tooling to produce the same. Such tooling may be standardized for a multiple of contact traces with a given pitch. The structure of contact trace $32_9$ having the J-lead can establish an improved physical strength because a large portion of which is supported by the contact substrate $20_2$. The further advantage of this example is that the length of the contact trace $32_9$ is about the same as that of the contact substrate $20_2$. In other words, the lead form and the attachment method to the PCB substrate in FIG. 20 does not consume any additional horizontal area than that consumed by the contact substrate $20_2$.

According to the present invention, the packaging and interconnection has a very high frequency bandwidth to meet the test requirements in the next generation semiconductor technology. The packaging and interconnection is able to mount the contact structure on a probe card or equivalent thereof by electrically connecting therewith through the edge of the contact structure. Moreover, because of a relatively small number of overall components to be assembled, the interconnection and packaging of the present invention can be fabricated with low cost and high reliability as well as high productivity.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A packaging and interconnection of a contact structure, comprising:
    a contact structure made of conductive material and formed on a contact substrate through a photolithography process, said contact structure having a base portion vertically formed on said contact substrate, a horizontal portion, one end of which being formed on said base portion, and a contact portion vertically formed on another end of said horizontal portion;
    a contact trace formed on said contact substrate and electrically connected to said contact structure at one end, the other end of said contact trace being extended toward an edge of said contact substrate;
    a printed circuit board (PCB) pad provided on a printed circuit board (PCB) substrate to be electrically connected with said other end of said contact trace;
    an elastomer provided under said contact substrate for allowing flexibility in said interconnection and packaging; and
    a support structure provided between said elastomer and said PCB substrate for supporting said contact structure, said contact substrate and said elastomer.

2. A packaging and interconnection of a contact structure as defined in claim 1, wherein said contact substrate is a silicon substrate on which said contact structure is directly formed through said photolithography process.

3. A packaging and interconnection of a contact structure as defined in claim 1, wherein said contact substrate is a dielectric substrate on which said contact structure is directly formed through said photolithography process.

4. A packaging and interconnection of a contact structure as defined in claim 1, wherein said contact trace is made of conductive material and formed through either a deposition, evaporation, sputtering or plating process.

5. A packaging and interconnection of a contact structure as defined in claim 1, wherein said PCB substrate is made of glass epoxy resin or ceramics.

6. A packaging and interconnection of a contact structure as defined in claim 1, wherein said PCB substrate is a multilayer printed circuit board.

7. A packaging and interconnection of a contact structure as defined in claim 1, wherein said support structure is made of ceramic, molded plastic or metal.

8. A packaging and interconnection of a contact structure as defined in claim 1, wherein said electrical connection between said other end of said contact trace and said PCB pad is established by wire bonding or soldering.

9. A packaging and interconnection of a contact structure as defined in claim 1, wherein said other end of said contact trace is formed of a gull-wing lead to be electrically connected to said PCB pad.

10. A packaging and interconnection of a contact structure as defined in claim 1, wherein said other end of said contact trace is formed of a gull-wing lead having an end portion thereof which is substantially parallel with a surface of said PCB pad.

11. A packaging and interconnection of a contact structure as defined in claim 1, wherein said other end of said contact trace is formed of at least two gull-wing leads to be electrically connected to corresponding PCB pads provided on said PCB substrate.

12. A packaging and interconnection of a contact structure as defined in claim 11, wherein said at least two gull-wing leads are aligned in a substantially vertical relationship with one another.

13. A packaging and interconnection of a contact structure as defined in claim 1, wherein said other end of said contact trace is formed of a J-lead to be electrically connected to said PCB pad.

14. A packaging and interconnection of a contact structure, comprising:
    a contact structure made of conductive material and formed on a contact substrate through a photolithography process, said contact structure having a base portion vertically formed on said contact substrate, a horizontal portion, one end of which being formed on said base portion, and a contact portion vertically formed on another end of said horizontal portion;
    a contact trace formed on said contact substrate and electrically connected to said contact structure at one end, the other end of said contact trace being extended toward an edge of said contact substrate;
    a connector for receiving said other end of said contact trace for establishing electrical connection therebetween;
    an elastomer provided under said contact substrate for allowing flexibility in said interconnection and packaging; and
    a support structure provided under said elastomer for supporting said contact structure, said contact substrate, said elastomer and said connector.

15. A packaging and interconnection of a contact structure as defined in claim 14, wherein said contact substrate is a silicon substrate on which said contact structure is directly formed through said photolithography process.

16. A packaging and interconnection of a contact structure as defined in claim 14, wherein said contact substrate is a dielectric substrate on which said contact structure is directly formed through said photolithography process.

17. A packaging and interconnection of a contact structure as defined in claim 14, wherein said contact trace is made of conductive material and formed through either a deposition, evaporation, sputtering or plating process.

18. A packaging and interconnection of a contact structure as defined in claim 14, wherein said support structure is made of ceramic, molded plastic or metal.

19. A packaging and interconnection of a contact structure as defined in claim 14, wherein said other end of said contact trace is formed of a gull-wing lead to be electrically connected to said connector.

20. A packaging and interconnection of a contact structure as defined in claim 14, wherein said other end of said contact trace is formed of a gull-wing lead having an end portion thereof which is substantially parallel with said support structure.

21. A packaging and interconnection of a contact structure as defined in claim 14, wherein said other end of said contact trace is formed of at least two gull-wing leads to be electrically connected to corresponding receptacles of said connector.

22. A packaging and interconnection of a contact structure as defined in claim 21, wherein said at least two gull-wing leads are aligned in a substantially vertical relationship with one another.

23. A packaging and interconnection of a contact structure, comprising:
- a contact structure made of conductive material and formed on a contact substrate through a photolithography process, said contact structure having a base portion vertically formed on said contact substrate, a horizontal portion, one end of which being formed on said base portion, and a contact portion vertically formed on another end of said horizontal portion;
- a contact trace formed on said contact substrate and electrically connected to said contact structure at one end, the other end of said contact trace being extended toward an edge of said contact substrate;
- a printed circuit board (PCB) pad provided on a printed circuit board (PCB) substrate to be electrically connected with said other end of said contact trace;
- a conductive bump provided between said other end of said contact trace and said PCB pad to establish electrical connection therebetween;
- an elastomer provided under said contact substrate for allowing flexibility in said interconnection and packaging; and
- a support structure provided between said elastomer and said PCB substrate for supporting said contact structure, said contact substrate and said elastomer.

24. A packaging and interconnection of a contact structure as defined in claim 23, wherein said contact substrate is a silicon substrate on which said contact structure is directly formed through said photolithography process.

25. A packaging and interconnection of a contact structure as defined in claim 23, wherein said contact substrate is a dielectric substrate on which said contact structure is directly formed through said photolithography process.

26. A packaging and interconnection of a contact structure as defined in claim 23, wherein said contact trace is made of conductive material and formed through either a deposition, evaporation, sputtering or plating process.

27. A packaging and interconnection of a contact structure as defined in claim 23, wherein said PCB substrate is made of glass epoxy resin or ceramics.

28. A packaging and interconnection of a contact structure as defined in claim 23, wherein said PCB substrate is a multilayer printed circuit board.

29. A packaging and interconnection of a contact structure as defined in claim 23, wherein said support structure is made of ceramic, molded plastic or metal.

30. A packaging and interconnection of a contact structure as defined in claim 23, wherein said conductive bump is a solder ball which reflows by application of heat to electrically connect said other end of said contact trace and said PCB pad.

31. A packaging and interconnection of a contact structure as defined in claim 23, wherein said conductive bump is a conductive polymer bump or a compliant bump to electrically connect said other end of said contact trace and said PCB pad.

32. A packaging and interconnection of a contact structure as defined in claim 23, wherein said other end of said contact trace is formed of a gull-wing lead to be electrically connected to said PCB pad.

33. A packaging and interconnection of a contact structure as defined in claim 23, wherein said other end of said contact trace is formed of at least two gull-wing leads to be electrically connected to corresponding PCB pads provided on said PCB substrate through corresponding conductive bumps.

34. A packaging and interconnection of a contact structure as defined in claim 33, wherein said at least two gull-wing leads are aligned in a substantially vertical relationship with one another.

35. A packaging and interconnection of a contact structure as defined in claim 23, wherein said other end of said contact trace is formed of a J-lead to be electrically connected to said PCB pad through said conductive bump.

36. A packaging and interconnection of a contact structure, comprising:
- a contact structure made of conductive material and formed on a contact substrate through a photolithography process, said contact structure having a base portion vertically formed on said contact substrate, a horizontal portion, one end of which being formed on said base portion, and a contact portion vertically formed on another end of said horizontal portion;
- a contact trace formed on said contact substrate and electrically connected to said contact structure at one end, the other end of said contact trace being extended toward an edge of said contact substrate;
- a printed circuit board (PCB) pad provided on a printed circuit board (PCB) substrate to be electrically connected with said other end of said contact trace;
- a conductive polymer provided between said other end of said contact trace and said PCB pad to establish electrically connection thereamong;
- an elastomer provided under said contact substrate for allowing flexibility in said interconnection and packaging; and
- a support structure provided between said elastomer and said PCB substrate for supporting said contact structure, said contact substrate and said elastomer.

37. A packaging and interconnection of a contact structure as defined in claim 36, wherein said contact substrate is a silicon substrate on which said contact structure is directly formed through said photolithography process.

38. A packaging and interconnection of a contact structure as defined in claim 36, wherein said contact substrate is a dielectric substrate on which said contact structure is directly formed through said photolithography process.

39. A packaging and interconnection of a contact structure as defined in claim 36, wherein said contact trace is made of conductive material and formed through either a deposition, evaporation, sputtering or plating process.

40. A packaging and interconnection of a contact structure as defined in claim 36, wherein said PCB substrate is made of glass epoxy resin or ceramics.

41. A packaging and interconnection of a contact structure as defined in claim 36, wherein said PCB substrate is a multilayer printed circuit board.

42. A packaging and interconnection of a contact structure as defined in claim 36, wherein said support structure is made of ceramic, molded plastic or metal.

43. A packaging and interconnection of a contact structure as defined in claim 36, wherein said conductive polymer is a conductive adhesive, conductive film, conductive paste or conductive particles.

44. A packaging and interconnection of a contact structure as defined in claim 36, wherein said conductive polymer is a conductive elastomer including an anisotropic conductive adhesive, anisotropic conductive film, anisotropic conductive paste or anisotropic conductive particles to electrically connect said other end of said contact trace and said PCB pad.

45. A packaging and interconnection of a contact structure as defined in claim 36, wherein said other end of said contact trace is formed of a gull-wing lead to be electrically connected to said PCB pad.

46. A packaging and interconnection of a contact structure as defined in claim 36, wherein said other end of said contact trace is formed of a gull-wing lead having an end portion thereof which is substantially parallel with a surface of said PCB pad.

47. A packaging and interconnection of a contact structure as defined in claim 36, wherein said other end of said contact trace is formed of at least two gull-wing leads to be electrically connected to corresponding PCB pads provided on said PCB substrate through corresponding conductive polymer.

48. A packaging and interconnection of a contact structure as defined in claim 36, wherein said at least two gull-wing leads are aligned in a substantially vertical relationship with one another.

49. A packaging and interconnection of a contact structure as defined in claim 36, wherein said other end of said contact trace is formed of a J-lead to be electrically connected to said PCB pad through said conductive polymer.

* * * * *